(12) United States Patent
Ionin et al.

(10) Patent No.: US 11,756,637 B2
(45) Date of Patent: Sep. 12, 2023

(54) BLOCK ERASE TYPE DETECTION USING BIT COUNT CHECK

(71) Applicant: Western Digital Technologies, Inc., San Jose, CA (US)

(72) Inventors: Michael Ionin, Rehovot (IL); Lior Avital, Zoran (IL); Tomer T. Eliash, Kfar Saba (IL); Lola Grin, Netanya (IL); Alexander Bazarsky, Holon (IL); Itay Busnach, Raanana (IL); Lior Bublil, Petach Tikva (IL); Mahim Gupta, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 162 days.

(21) Appl. No.: 17/534,832

(22) Filed: Nov. 24, 2021

(65) Prior Publication Data

US 2023/0162808 A1 May 25, 2023

(51) Int. Cl.
*G11C 16/16* (2006.01)
*G11C 16/34* (2006.01)
*G11C 16/26* (2006.01)

(52) U.S. Cl.
CPC .......... *G11C 16/3445* (2013.01); *G11C 16/16* (2013.01); *G11C 16/26* (2013.01); *G11C 16/3404* (2013.01)

(58) Field of Classification Search
CPC ..... G11C 16/3445; G11C 16/16; G11C 16/26; G11C 16/3404; G11C 11/5635; G11C 16/0483
See application file for complete search history.

(56) References Cited

U.S. PATENT DOCUMENTS

| | | | |
|---|---|---|---|
| 6,977,847 | B2 | 12/2005 | Lasser et al. |
| 8,151,034 | B2 | 4/2012 | Gorobets et al. |
| 9,159,423 | B1 | 10/2015 | Brahmadathan et al. |
| 9,478,271 | B2 | 10/2016 | Chen et al. |
| 9,792,998 | B1 | 10/2017 | Yang et al. |
| 10,658,045 | B1 | 5/2020 | Yang et al. |
| 2019/0107961 | A1 | 4/2019 | Lee |
| 2019/0278490 | A1 | 9/2019 | Muchherla et al. |
| 2022/0383964 | A1* | 12/2022 | Jeong ............... G11C 16/14 |

* cited by examiner

*Primary Examiner* — Xiaochun L Chen
(74) *Attorney, Agent, or Firm* — PATTERSON + SHERIDAN, LLP; Steven H. VerSteeg (57) ABSTRACT

A data storage device includes a memory device and a controller coupled to the memory device. The controller is configured to determine that a power loss event has occurred, determine that one or more blocks are in an erased state, examine a block of the one or more blocks to determine whether the block is a SLC erased block or a TLC erased block, and place the block in a SLC pre-erase heap if the block is the SLC erased block or in a TLC pre-erase heap if the block is the TLC erased block. The controller is further configured to determine a first bit count of page0 for a SLC voltage for the block, determine a second bit count of page1 for a TLC voltage for the block, and classify the block as either a SLC erased block or a TLC erased block.

20 Claims, 8 Drawing Sheets

SOLID LINE = VT AFTER PROGRAM
DASHED LINE = VT AFTER ERASE

BLOCK ERASE TYPE DETECTION USING BIT COUNT CHECK

BACKGROUND OF THE DISCLOSURE

Field of the Disclosure

Embodiments of the present disclosure generally relate to a data storage device, such as a solid state drive (SSD), and, more specifically, detecting a block erase type after a power loss event.

Description of the Related Art

A pre-erase feature in a memory device of a data storage device allows the firmware to improve write performance by erasing single level cell (SLC) blocks as SLC erased blocks when the data storage device is idle, rather than prior to a write to the SLC blocks. Similarly, triple level cell (TLC) blocks may be pre-erased as a TLC erased block. When a ungraceful shutdown (UGSD) occurs or a similar power loss event occurs, the firmware may not be able to distinguish between blocks erased as a SLC erased block and blocks erased as a TLC erased block.

Issues arise when programming SLC data in a TLC erased block because the SLC program trim is calibrated for a SLC erased block and not the TLC erased block. Therefore, programming SLC data in a TLC erased block may cause a program failure. In order to avoid these issues, the erased block is flash filled, which may be a soft program across all wordlines of the block. After the erased block is flash filled, the block is erased depending on the type of data to be programmed to the block. For example, if TLC data is to be programmed to the block, the block is then TLC erased, and if SLC data is to be programmed to the block, the block is then SLC erased. However, the flash filling and erasing of the block increases the program erase count (PEC) of the block and may degrade the performance and the endurance of the block.

Therefore, there is a need in the art for an improved block erase type detection.

SUMMARY OF THE DISCLOSURE

The present disclosure generally relates to a data storage device, such as a solid state drive (SSD), and, more specifically, detecting a block erase type after a power loss event. A data storage device includes a memory device and a controller coupled to the memory device. The controller is configured to determine that a power loss event has occurred, determine that one or more blocks are in an erased state, examine a block of the one or more blocks to determine whether the block is a SLC erased block or a TLC erased block, and place the block in a SLC pre-erase heap if the block is the SLC erased block or in a TLC pre-erase heap if the block is the TLC erased block. The controller is further configured to determine a first bit count of page0 for a SLC voltage for the block, determine a second bit count of page1 for a TLC voltage for the block, and classify the block as either a SLC erased block or a TLC erased block.

In one embodiment, a data storage device includes a memory device and a controller coupled to the memory device. The controller is configured to determine that a power loss event has occurred, determine that one or more blocks are in an erased state, examine a block of the one or more blocks to determine whether the block is a SLC erased block or a TLC erased block, and place the block in a SLC pre-erase heap if the block is the SLC erased block or in a TLC pre-erase heap if the block is the TLC erased block.

In another embodiment, a data storage device includes a memory device and a controller coupled to the memory device. The controller is configured to determine that a block is an erased state, determine a first bit count of page0 for a SLC voltage for the block, determine a second bit count of page1 for a TLC voltage for the block, and classify the block as either a SLC erased block or a TLC erased block.

In another embodiment, a data storage device includes memory means and a controller coupled to the memory means. The controller is configured to determine that a block is in an erased state, attempt to determine that the block is a SLC erased block or a TLC erased block, flash fill the block, and erase the block.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a data storage device, such as a solid state drive (SSD), and, more specifically, detecting a block erase type after a power loss event. A data storage device includes a memory device and a controller coupled to the memory device. The controller is configured to determine that a power loss event has occurred, determine that one or more blocks are in an erased state, examine a block of the one or more blocks to determine whether the block is a SLC erased block or a TLC erased block, and place the block in a SLC pre-erase heap if the block is the SLC erased block or in a TLC pre-erase heap if the block is the TLC erased block. The controller is further configured to determine a first bit count of page0 for a SLC voltage for the block, determine a second bit count of page1 for a TLC voltage for the block, and classify the block as either a SLC erased block or a TLC erased block.

Figure 1:
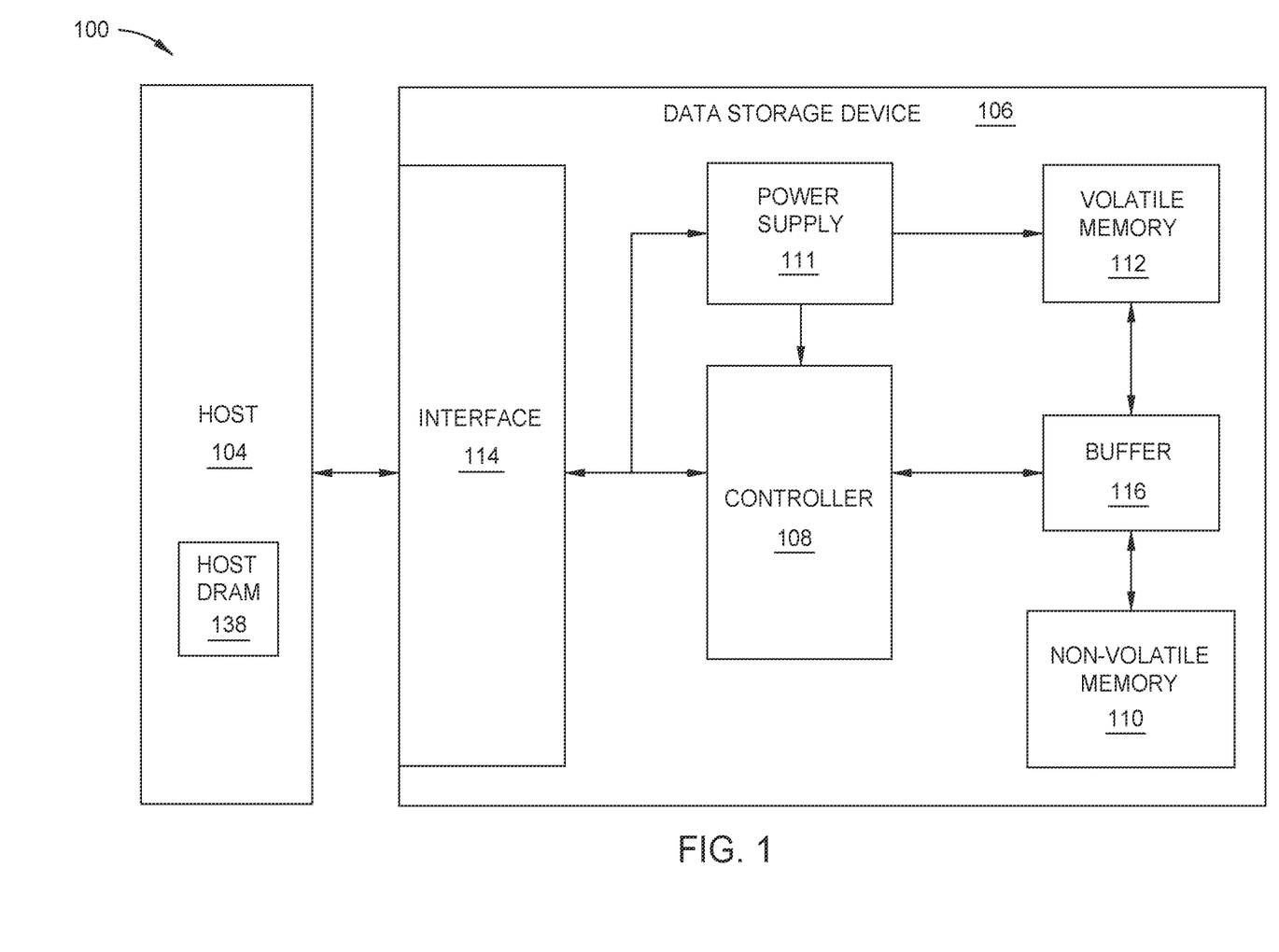
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe ×1, ×4, ×8, ×16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2A:
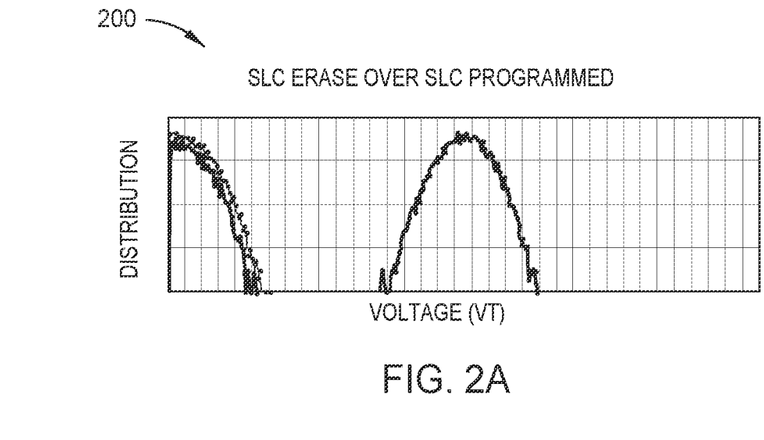
FIG. 2A is a graph illustrating an exemplary embodiment of a voltage curve for a SLC block being SLC programmed and SLC erased, according to certain embodiments.

FIG. 2A is a graph 200 illustrating an exemplary embodiment of a voltage curve for a SLC block being SLC programmed and SLC erased, according to certain embodiments. Graph 200 shows a voltage distribution curve for an SLC cell after SLC programming (solid line) and a voltage curve for the SLC cell after being SLC erased (dashed line). The curves represents a distribution, such that when sensing the voltage of a cell, the voltage for a certain cell state may be located somewhere on the curve.

The SLC block may be a block of an NVM, such as the NVM 110 of FIG. 1. An SLC block includes a plurality of SLC memory cells, where each SLC cell holds a single bit. Each bit of the SLC cell may be a 1 or a 0. A programmed bit may have a bit value of 0 and an unprogrammed or erased bit may have a bit value of 1. Furthermore, the number of cell states may be determined by the following equation: # of Cell States=$2^n$, where n is the number of bits per memory cell. For an SLC cell, the number of cell states is 2 (i.e., Er and A). As shown in graph 200, after SLC erasing the SLC cell, the voltage curve for Er remains (i.e., a tail).

Figure 2B:
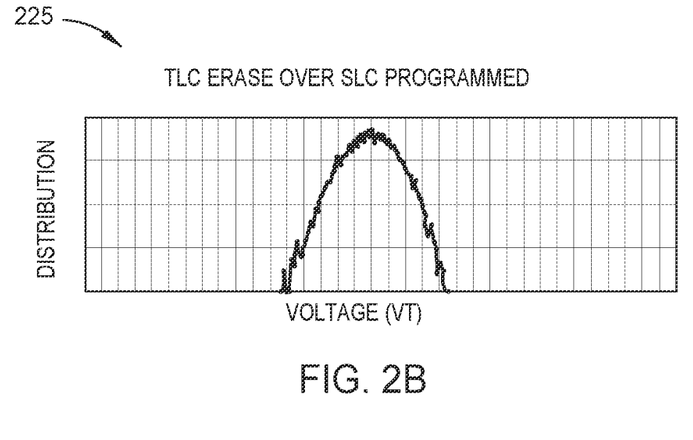
FIG. 2B is a graph illustrating an exemplary embodiment of a voltage curve for a SLC block being SLC programmed and TLC erased, according to certain embodiments.

FIG. 2B is a graph 225 illustrating an exemplary embodiment of a voltage curve for a SLC block being SLC programmed and TLC erased, according to certain embodiments. Graph 225 shows a voltage distribution curve for an SLC cell after SLC programming (solid line) and a voltage curve for the SLC cell after being TLC erased (dashed line). As shown in graph 225, after TLC erasing the SLC memory cell, no voltage curves for either cell state remains.

Figure 2C:
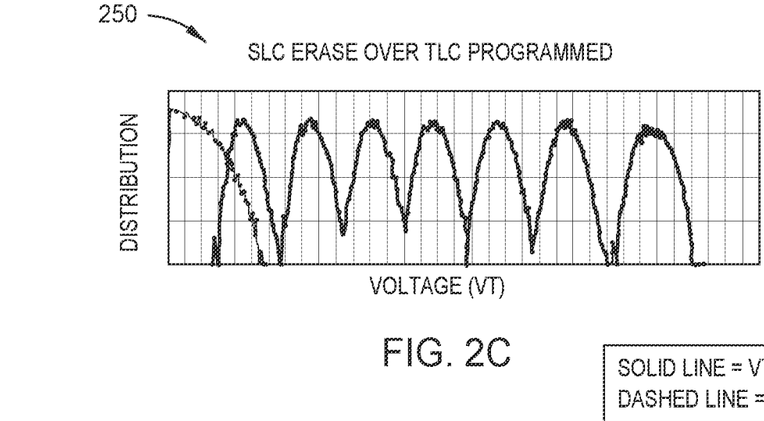
FIG. 2C is a graph illustrating an exemplary embodiment of a voltage curve for a TLC block being TLC programmed and SLC erased, according to certain embodiments.

FIG. 2C is a graph 250 illustrating an exemplary embodiment of a voltage curve for a TLC block being TLC programmed and SLC erased, according to certain embodiments. Graph 250 shows a voltage distribution curve for a TLC cell after TLC programming (solid line) and a voltage curve for the TLC cell after being SLC erased (dashed line). The curves represents a distribution, such that when sensing the voltage of a cell, the voltage for a certain cell state may be located somewhere on the curve.

The TLC block may be a block of an NVM, such as the NVM 110 of FIG. 1. An TLC block includes a plurality of TLC memory cells, where each TLC cell holds three bits. Each bit of the TLC cell may be a 1 or a 0. A programmed bit may have a bit value of 0 and an unprogrammed or erased bit may have a bit value of 1. Furthermore, the number of cell states may be determined by the following equation: # of Cell States =$2^n$, where n is the number of bits per memory cell. For a TLC cell, the number of cell states is 8 (i.e., Er, A, B, C, D, E, F, and G). As shown in graph 250, after SLC erasing the TLC cell, the voltage curve for Er remains (i.e., a tail).

Figure 2D:
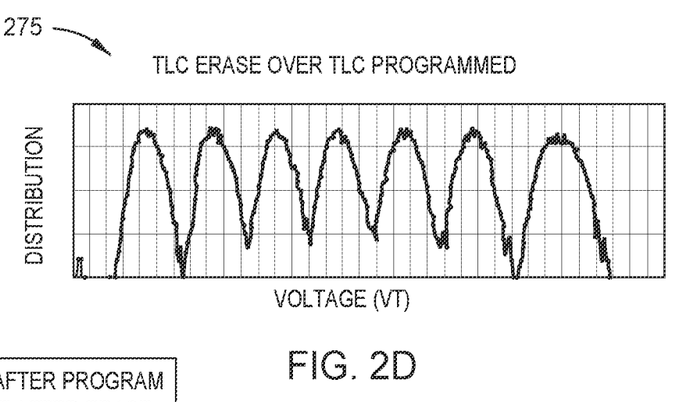
FIG. 2D is a graph illustrating an exemplary embodiment of a voltage curve for a TLC block being TLC programmed and TLC erased, according to certain embodiments.

FIG. 2D is a graph 275 illustrating an exemplary embodiment of a voltage curve for a TLC block being TLC programmed and TLC erased, according to certain embodiments. Graph 200 shows a voltage distribution curve for a TLC cell after TLC programming (solid line) and a voltage curve for the TLC cell after being TLC erased (dashed line). As shown in graph 275, after TLC erasing the TLC cell, no voltage curves for the plurality of cell states remain.

As shown in graphs 200, 225, 250, 275, the voltage distribution after an erase operation occurs depends on the erase operation type. Furthermore, the voltage distribution may be shifted due to various parameters such as block endurance and block temperature. The presence of an Er tail may be determined by a controller, such as the controller 108 of FIG. 1, performing a data miscompare check. The data miscompare check includes checking how many bits are above a verify level and determining if the number of bits above the verify level exceeds a threshold number of bits. When the number of bits above the verify level exceeds the threshold number of bits, the block may be defined as SLC erased due to the presence of an Er tail. In one example, the verify level is set at 0 volts.

Figure 3:
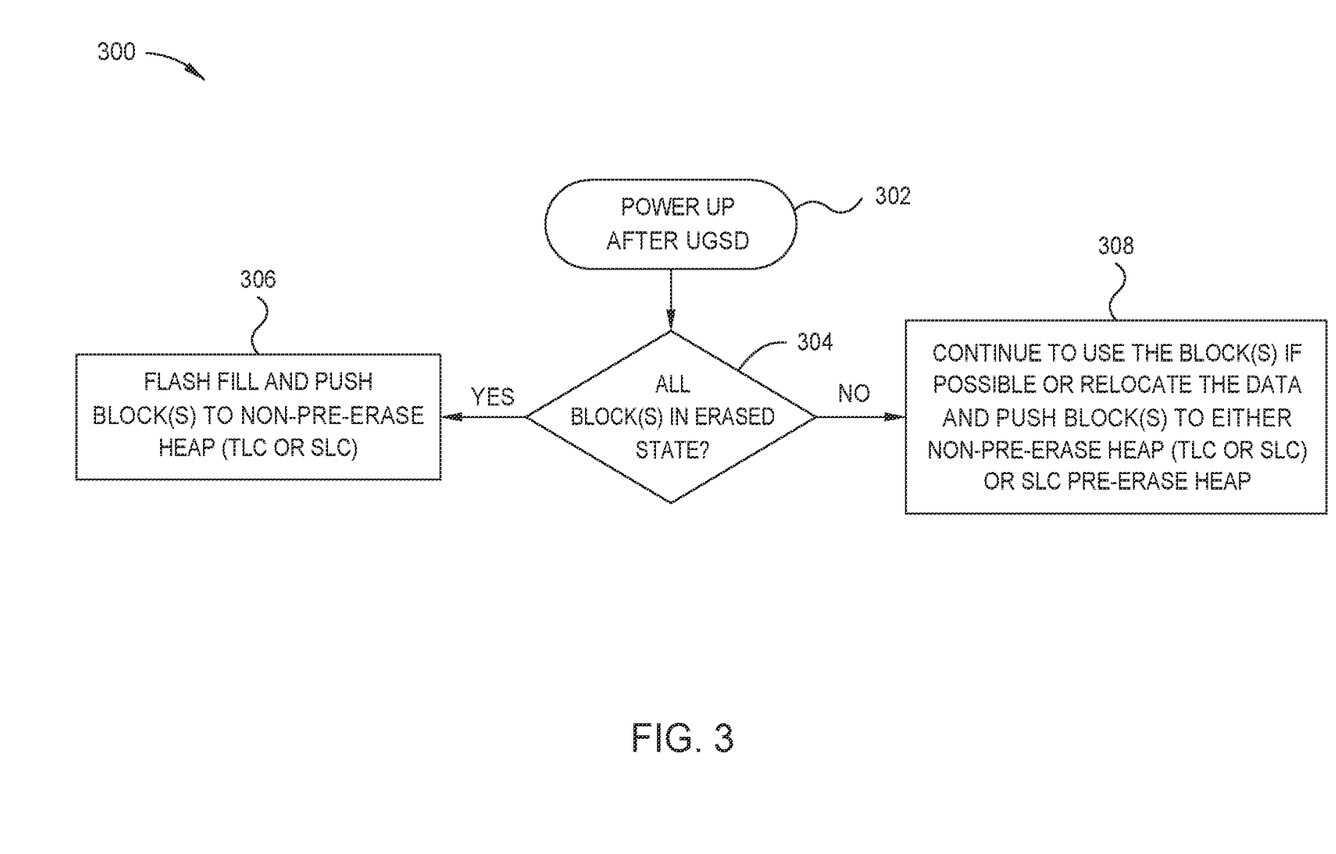
FIG. 3 is a flow diagram illustrating a method of pre-erasing after a power loss event, according to certain embodiments.

FIG. 3 is a flow diagram illustrating a method 300 of pre-erasing after a power loss event, according to certain embodiments. Method 300 may be executed by a controller, such as the controller 108 of FIG. 1, where a block or blocks may be the block or blocks of an NVM, such as the NVM 110 of FIG. 1. A block may be considered a hybrid block, where the block may be either SLC programmed or TLC programmed. It is to be understood that the programming of a hybrid block is not limited to SLC programming and TLC programming. Furthermore, a power loss event may occur due to a connection loss between a host device, such as the host device 104 of FIG. 1, and a data storage device, such as the data storage device 106 of FIG. 1, coupled to the host device 104. Aspects of the storage system 100 of FIG. 1 may be referenced for exemplary purposes. Furthermore, a power loss event may be an UGSD event, where the data storage device 106 loses power and may not be able to back up or flush data to the NVM 110. For exemplary purposes herein, UGSD may refer to any power loss event.

At block 302, the data storage device 106 powers up after an UGSD occurred. The powering of the data storage device 106 may be due to a reconnection of a power source to the data storage device 106 and providing the power supply 111 with power. At block 304, the controller 108 determines if all blocks are in an erased state. It is to be understood that the term "blocks" may refer to one or more blocks for exemplary purposes herein.

If all the blocks are in the erased state at block 304, then the controller 108 flash fills the erased blocks and places the flash filled blocks in a non-pre-erase heap at block 306. In one example, the non-pre-erase heap includes a heap for TLC blocks and a heap for SLC blocks. In another example, the non-pre-erase heap may be a combined SLC block and TLC block heap. The term "heap" may refer to a group, queue, pool, or list. The term "non-pre-erase" refers to blocks not yet erased. Furthermore, the blocks may be ordered in the either the non-pre-erase heap or the pre-erase based on a PEC value of the block. However, if all the blocks are not in an erased state at block 304, then the controller 108 continues to use the blocks if possible (e.g., write operations) or relocates the data (e.g., garbage collection) at block 308. After relocating the data, the controller 108 places the blocks that were including the data prior to the relocation of the data either into a non-pre-erase heap if the blocks were not erased or into an SLC pre-erase heap if the blocks were SLC erased as part of the data relocation operation.

Because blocks are either flash filled and placed in a non-pre-erased heap or SLC erased and placed in a SLC pre-erased heap, a violation of SLC programming over a TLC erased block may be avoided. Furthermore, blocks in a non-pre-erased heap are erased based on the next program operation type. For example, a block that is to be used for a SLC operation will be SLC erased prior to programming the block with TLC data and a block that is to be used for a TLC operation will be TLC erased prior to programming the block with TLC data.

Figure 4:
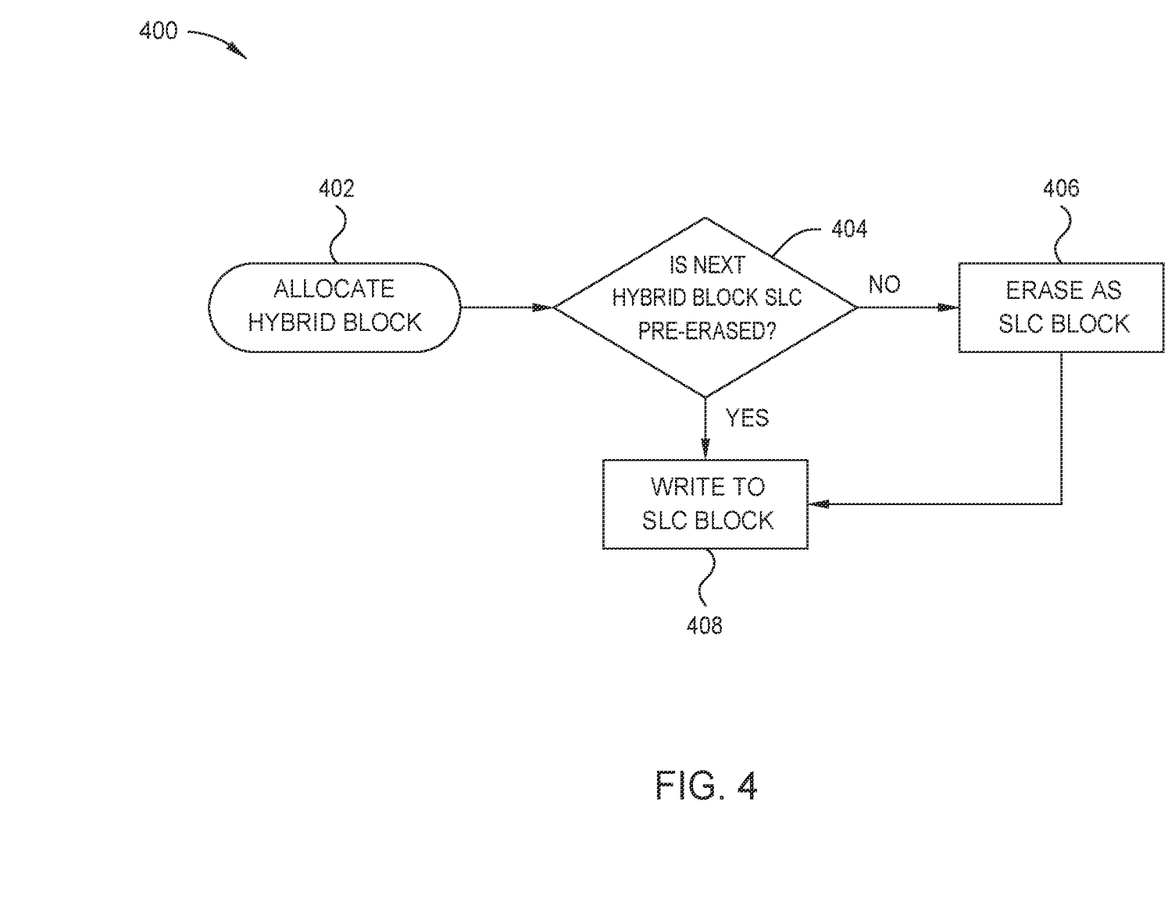
FIG. 4 is a flow diagram illustrating a method of allocating a hybrid block, according to certain embodiments.

FIG. 4 is a flow diagram illustrating a method 400 of allocating a hybrid block, according to certain embodiments. Method 400 may be executed by a controller, such as the controller 108 of FIG. 1, in order to write SLC data to a hybrid block. A hybrid block of an NVM, such as the NVM 110 of FIG. 1, may refer to a block that may be programmed as an SLC block or a TLC block. It is to be understood that the programming of a hybrid block is not limited to SLC programming and TLC programming. Aspects of the storage system 100 of FIG. 1 may be referenced herein for exemplary purposes.

At block 402, the controller 108 allocates a hybrid block. The hybrid block may be allocated from a heap, where the heap is ordered based on a PEC value. For example, the hybrid blocks may be ordered from lowest PEC value to highest PEC value. At block 404, the controller 108 determines if the next hybrid block (i.e., the next in the ordered list) is SLC pre-erased. If the next hybrid block is not SLC pre-erased at block 404, then the controller 108 erases the hybrid block as a SLC erased block at block 406. However, if the next hybrid block is SLC pre-erased at block 404 or if the controller 108 has SLC erased the hybrid block at block 406, then the controller 108 writes SLC data to the SLC erased block at block 408.

Figure 5:
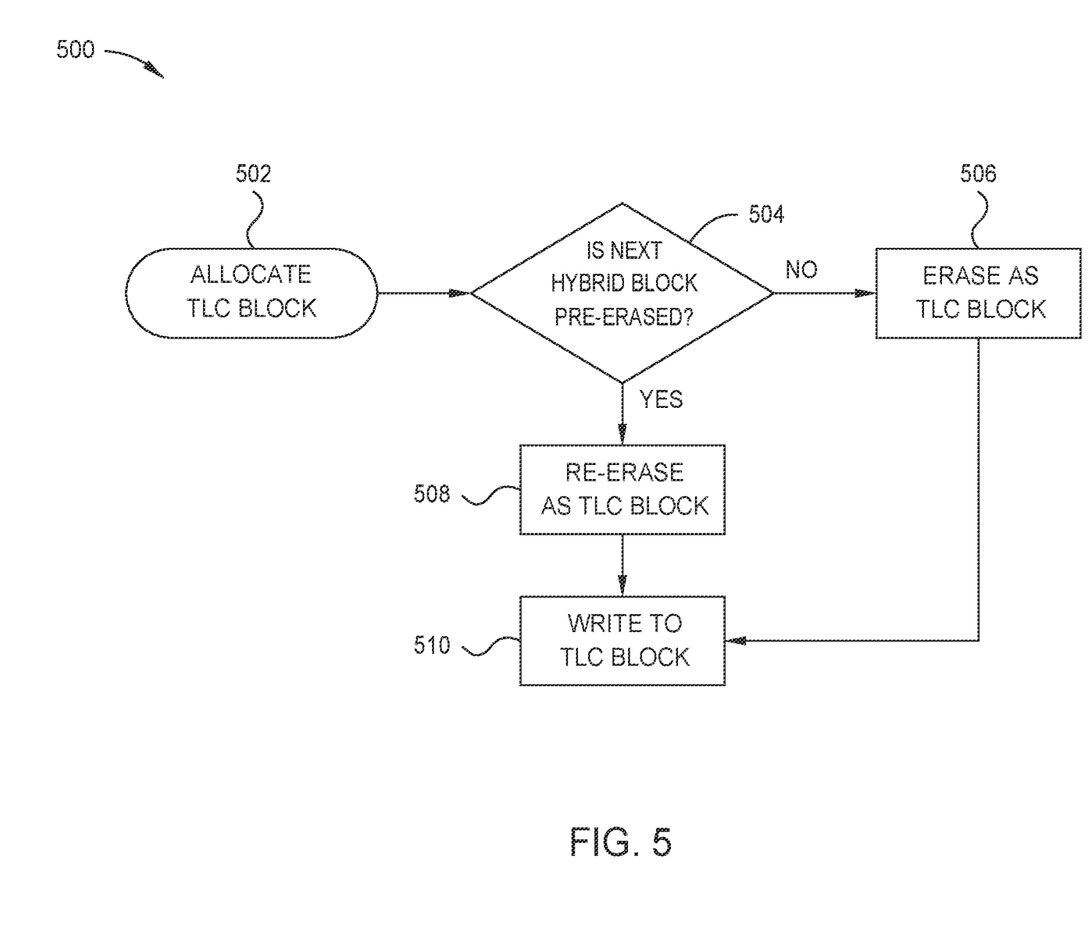
FIG. 5 is a flow diagram illustrating a method of allocating a hybrid block, according to certain embodiments.

FIG. 5 is a flow diagram illustrating a method 500 of allocating a hybrid block, according to certain embodiments. Method 500 may be executed by a controller, such as the controller 108 of FIG. 1, in order to write TLC data to a hybrid block allocated as a TLC block. A hybrid block of an NVM, such as the NVM 110 of FIG. 1, may refer to a block that may be programmed as an SLC block or a TLC block. It is to be understood that the programming of a hybrid block is not limited to SLC programming and TLC programming. Aspects of the storage system 100 of FIG. 1 may be referenced herein for exemplary purposes.

At block 502, the controller 108 allocates a TLC block. At block 504, the controller 108 determines if the next hybrid block is pre-erased (e.g., SLC pre-erased, TLC pre-erased, or inconclusive). If the next hybrid block is not TLC erased at block 504, then the controller 108 TLC erases the next hybrid block at block 506. At block 510, the controller 108 writes to the TLC erased block. However, if the next hybrid block is pre-erased at block 504, then the controller 108 re-erases the next hybrid block as a TLC block in order to avoid programming TLC data to an SLC erased block at block 508. At block 510, the controller 108 writes to the TLC erased block. In some cases, external conditions, such as abnormal temperature changes or conditions causing high BER, may cause the controller 108 to allocate a higher than expected amount of hybrid blocks as TLC blocks.

Figure 6A:
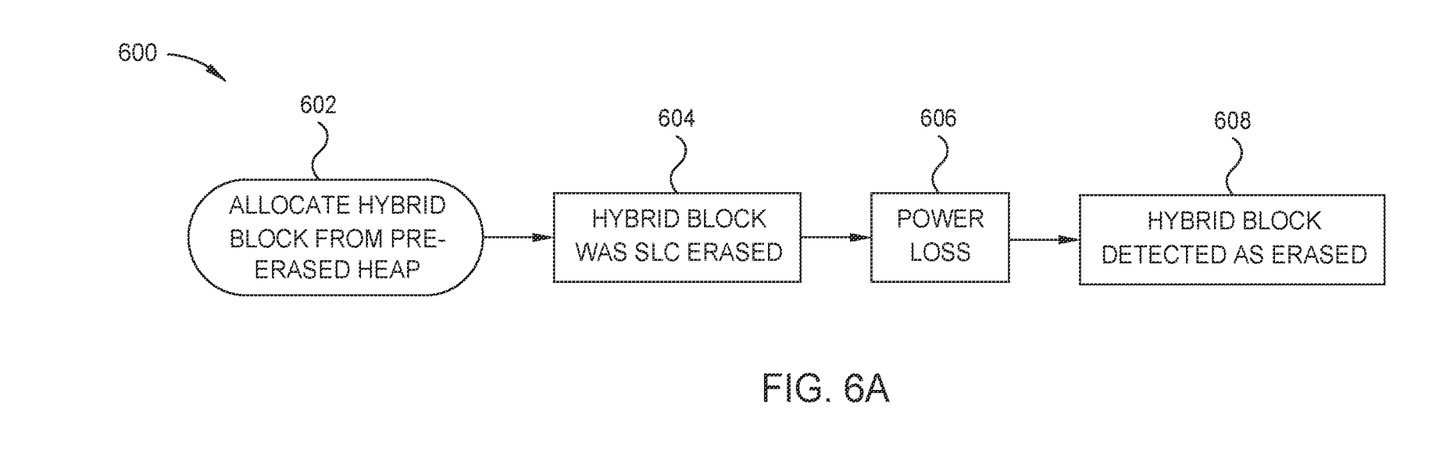
FIGS. 6A and 6B are flow diagrams illustrating an ungraceful shutdown triggering a loss of block erase type information, according to certain embodiments.
Figure 6B:
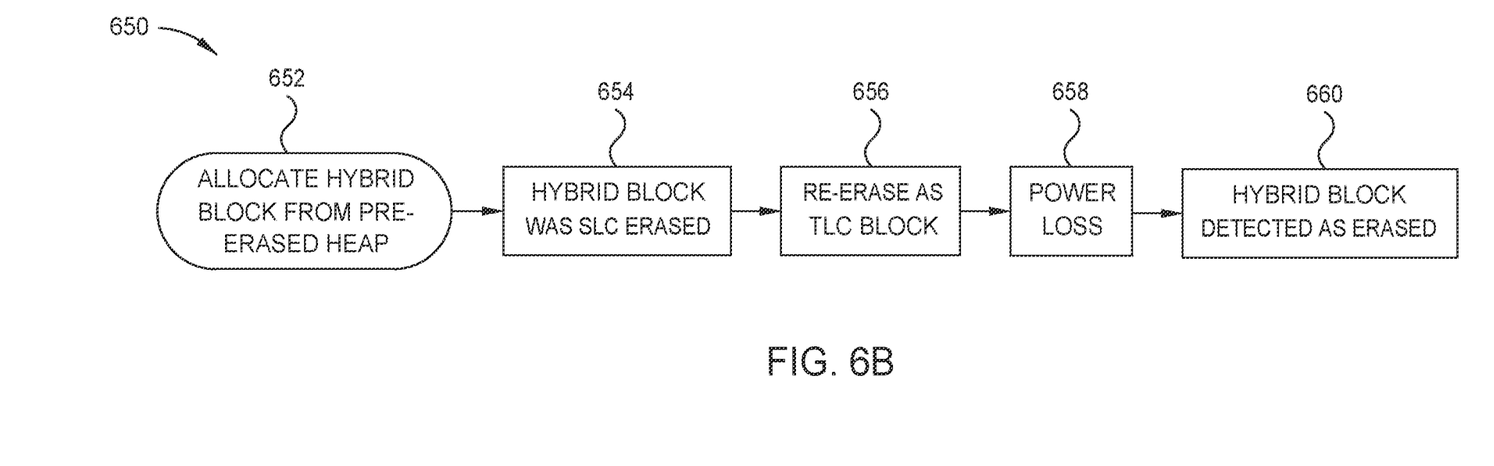

FIGS. 6A and 6B are flow diagrams 600, 650 illustrating an ungraceful shutdown triggering a loss of block erase type information, according to certain embodiments. An NVM, such as the NVM 110 of FIG. 1, includes a plurality of blocks, where an erased block is a block or a hybrid block that has been erased. A hybrid block may refer to a block that may be programmed as an SLC block or a TLC block. It is to be understood that the programming of a hybrid block is not limited to SLC programming and TLC programming. Aspects of the storage system 100 of FIG. 1 may be referenced for exemplary purposes.

Flow diagrams 600, 650 may illustrate the process of a controller, such as the controller 108 of FIG. 1, detecting an erased block after a power loss event, such as a UGSD event. A power loss event may occur due to a connection loss between a host device, such as the host device 104 of FIG. 1, and a data storage device, such as the data storage device 106 of FIG. 1, coupled to the host device 104. Furthermore, a power loss event may be an UGSD event, where the data storage device 106 loses power and may not be able to back up or flush data to the NVM 110. For exemplary purposes herein, UGSD may refer to any power loss event.

Referring to flow diagram 600, the controller 108 allocates a hybrid block from a pre-erased heap at block 602. At block 604, the controller 108 determines that the hybrid block was SLC erased. At block 606, a power loss event occurs. After the data storage device 106 is powered on again, the controller 108 detects the hybrid block as erased at block 608. However, the controller 108 may not be able to determine whether the erased hybrid block was SLC erased or TLC erased.

Referring to flow diagram 650, the controller 108 allocates a hybrid block from a pre-erased heap at block 602. At block 604, the controller 108 determines that the hybrid block was SLC erased. At block 606, the controller 108 determines that the hybrid block is to be used as a TLC block, where the controller 108 then flash fills and TLC erases the hybrid block. At block 608, a power loss event occurs. After the data storage device 106 is powered on again, the controller 108 detects the hybrid block as erased at block 610. However, the controller 108 may not be able to determine whether the erased hybrid block was SLC erased or TLC erased.

Figure 7:
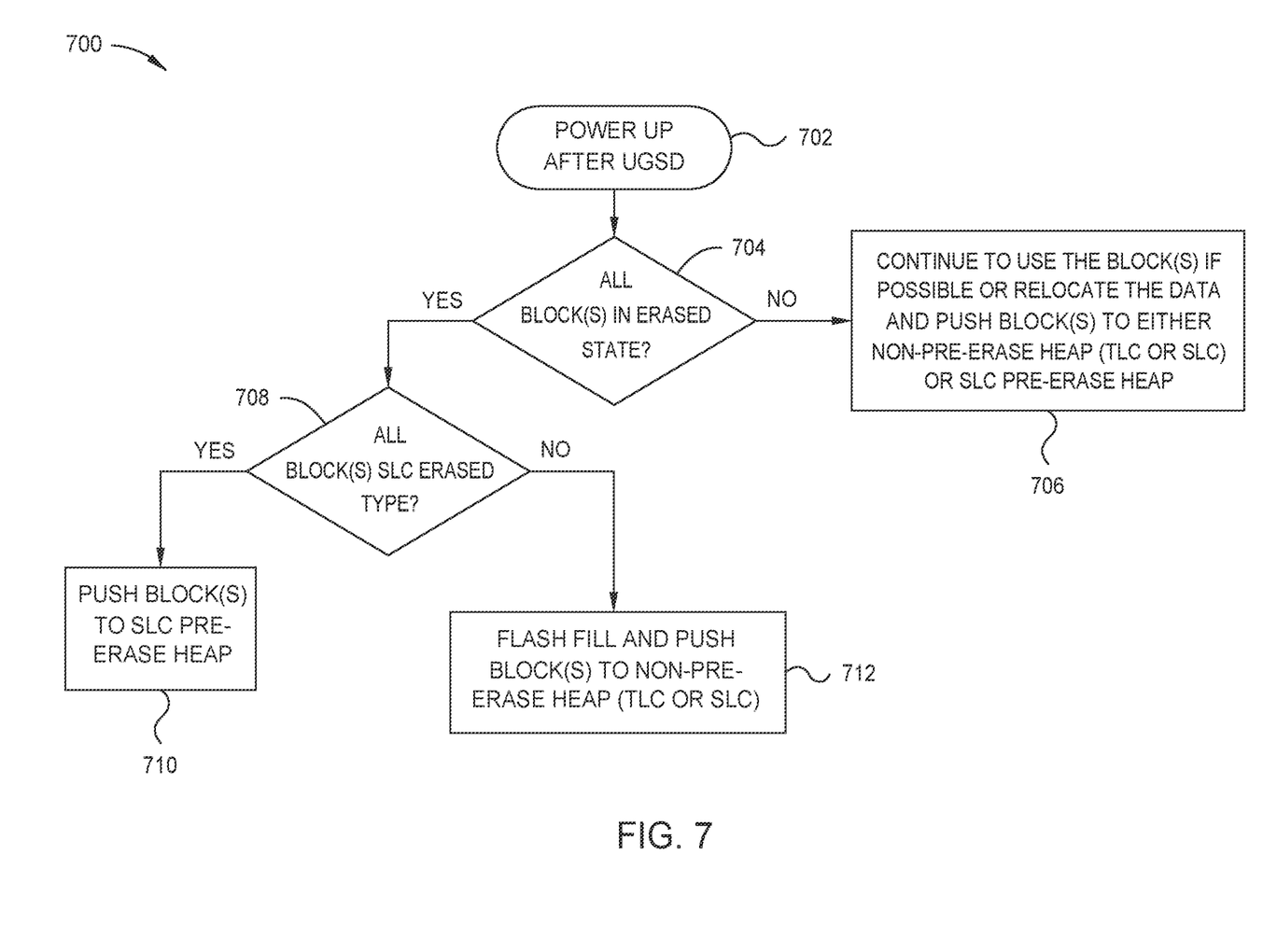
FIG. 7 is a flow diagram illustrating a method of detecting a block erase type after a power loss event, according to certain embodiments.

FIG. 7 is a flow diagram illustrating a method 700 of detecting a block erase type after a power loss event, according to certain embodiments. Method 700 may be executed by a controller, such as the controller 108 of FIG. 1, where a block or blocks may be the block or blocks of an NVM, such as the NVM 110 of FIG. 1. Furthermore, the block or blocks of the NVM 110 may be a hybrid block. A hybrid block may refer to a block that may be programmed as an SLC block or a TLC block. It is to be understood that the programming of a hybrid block is not limited to SLC programming and TLC programming. Aspects of the storage system 100 of FIG. 1 may be referenced for exemplary purposes. A power loss event may occur due to a connection loss between the host device 104 and the data storage device 106 coupled to the host device 104. For example, a power loss event may be an UGSD event, where the data storage device 106 loses power and may not be able to back up or flush data to the NVM 110. For exemplary purposes herein, UGSD may refer to any power loss event.

At block 702, the data storage device 106 powers up after a UGSD event. At block 704, the controller 108 determines if all the blocks are in an erased state. It is to be understood that the term "blocks" may refer to one or more blocks for exemplary purposes herein. If all the blocks are not in an erased state at block 706, then the controller 108 continues to use the blocks if possible (e.g., write operations) or relocates the data (e.g., garbage collection) at block 706. After relocating the data, the controller 108 places the blocks that were including the data prior to the relocation of the data either into a non-pre-erase heap if the blocks were not erased or into an SLC pre-erase heap if the blocks were SLC erased as part of the data relocation operation.

However, if all the blocks are in an erased state at block 704, then the controller 108 determines if all the blocks are SLC erased at block 708. If all the blocks are SLC erased at block 708, then the controller 108 pushes the blocks to the SLC pre-erase heap at block 710. However, if the blocks are not SLC erased at block 708, then the controller 108 flash fills the blocks and pushes the blocks to the non-pre-erase heap at block 712. It is to be understood that less than or equal the total number of erased blocks may be SLC erased and placed in the SLC pre-erase heap, where the remaining number of erased blocks may be flash filled and pushed to the non-pre-erase heap.

Figure 8:
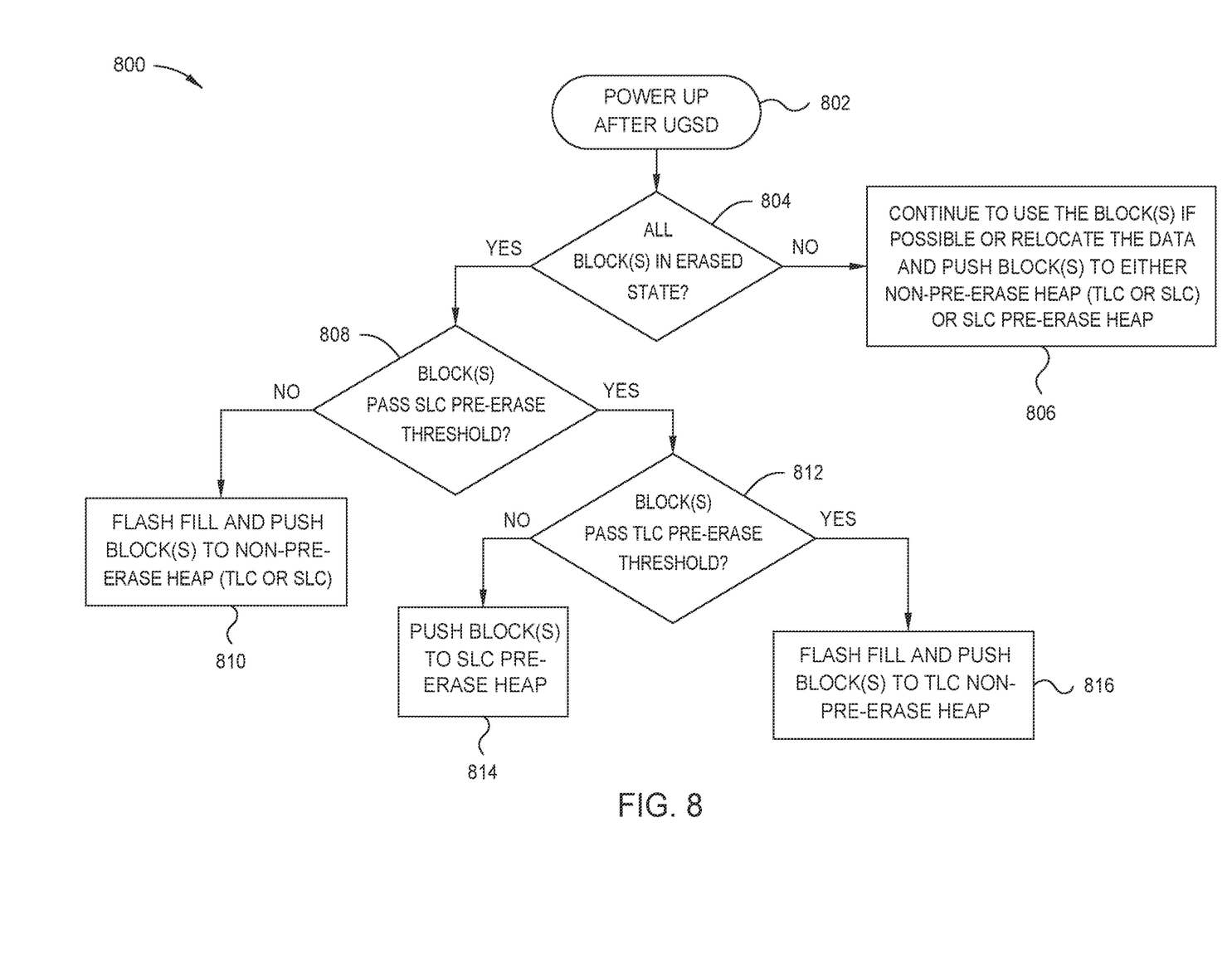
FIG. 8 is a flow diagram illustrating a method of detecting a block erase type after a power loss event, according to certain embodiments.

FIG. 8 is a flow diagram illustrating a method 800 of detecting a block erase type after a power loss event, according to certain embodiments. Method 800 may be executed by a controller, such as the controller 108 of FIG. 1, where a block or blocks may be the block or blocks of an NVM, such as the NVM 110 of FIG. 1. Furthermore, the block or blocks of the NVM 110 may be a hybrid block. A hybrid block may refer to a block that may be programmed as an SLC block or a TLC block. It is to be understood that the programming of a hybrid block is not limited to SLC programming and TLC programming. Aspects of the storage system 100 of FIG. 1 may be referenced for exemplary purposes. A power loss event may occur due to a connection loss between the host device 104 and the data storage device 106 coupled to the host device 104. For example, a power loss event may be an UGSD event, where the data storage device 106 loses power and may not be able to back up or flush data to the NVM 110. For exemplary purposes herein, UGSD may refer to any power loss event.

At block 802, the data storage device 106 powers up after a UGSD event. At block 804, the controller 108 determines if all the blocks are in an erased state. It is to be understood that the term "blocks" may refer to one or more blocks for exemplary purposes herein. If all the blocks are not in an erased state at block 804, then the controller 108 continues to use the blocks if possible (e.g., write operations) or relocates the data (e.g., garbage collection) at block 808. After relocating the data, the controller 108 places the blocks that were including the data prior to the relocation of the data either into a non-pre-erase heap if the blocks were not erased or into an SLC pre-erase heap if the blocks were SLC erased as part of the data relocation operation.

However, if all the blocks are in an erased state at block 804, then the controller 108 determines if the blocks have passed a SLC pre-erase threshold at block 808, where the SLC pre-erase threshold refers to determining a number of bits above a verify level on page0 of the block. The controller 108 executing a data miscompare check in order to determine the number of bits that are the verify level on page0 of the block The SLC pre-erase threshold may refer to determining a number of bits that are above a verify level and determining if the number of bits above the verify level exceeds a threshold number of bits. When the number of bits above the verify level exceeds the threshold number of bits, then the controller 108 determines that the page0 has passed the SLC pre-erased threshold. In other words, there is an erase (Er) tail on page0. If the blocks does not pass the SLC pre-erase threshold at block 808, then the controller 108 flash fills and pushes the blocks to a non-pre-erase heap at block 810.

However, if the blocks passes the SLC pre-erase threshold at block 808, then the controller 108 determines if the blocks passes a TLC pre-erase threshold at block 812, where the TLC pre-erase threshold refers to determining a number of bits above a verify level on page1 of the block. The controller 108 executing a data miscompare check in order to determine the number of bits that are the verify level on page1 of the block. If the blocks does not pass the TLC pre-erase threshold at block 812, then the controller 108 pushes the blocks to the SLC pre-erase heap at block 814. However, if the blocks passes the TLC pre-erase threshold at block 812, then the controller 108 flash fills and pushes the blocks to the TLC non-pre-erase heap at block 816. It is to be understood that less than or equal the total number of erased blocks may not pass the TLC pre-erase threshold and placed in the SLC pre-erase heap, where the remaining number of erased blocks may be flash filled and pushed to the TLC non-pre-erase heap. Because both a SLC erase and a TLC program abort on page0 may show the same voltage distribution curve, an additional check of the bit count on TLC may be needed to distinguish between the SLC erase and the TLC program abort.

By determining a block erase type using a bit count check, the endurance and performance of the memory device may be improved.

In one embodiment, a data storage device includes a memory device and a controller coupled to the memory device. The controller is configured to determine that a power loss event has occurred, determine that one or more blocks are in an erased state, examine a block of the one or more blocks to determine whether the block is a SLC erased block or a TLC erased block, and place the block in a SLC pre-erase heap if the block is the SLC erased block or in a TLC pre-erase heap if the block is the TLC erased block.

The block is a hybrid block. The hybrid block is configured to store either SLC data or TLC data. The controller is further configured to check a first bit count at a first erase voltage threshold on page0 of the block. Based upon the first erase voltage threshold, the controller is further configured to classify the block as the TLC erased block or the SLC erased block. The controller is further configured to place the block in the TLC pre-erase heap upon classifying the block as the TLC erased block. The controller is further configured to check a second bit count at a second erase voltage threshold on page1 of the block. The checking occurs after determining that the first bit count is above a bit count threshold for the first erase voltage threshold. Based upon the second erase voltage threshold, the controller is further configured to classify the block as the TLC erased block or the SLC erased block. The controller is further configured to determine if erasing is needed upon the examining. The controller is further configured to erase the block when the block cannot be determined as the SLC erased block or the TLC erased block. The controller is further configured to flash fill the block prior to the erasing.

In another embodiment, a data storage device includes a memory device and a controller coupled to the memory device. The controller is configured to determine that a block is an erased state, determine a first bit count of page0 for a SLC voltage for the block, determine a second bit count of page1 for a TLC voltage for the block, and classify the block as either a SLC erased block or a TLC erased block.

The SLC voltage is a SLC erase voltage. The TLC voltage is a TLC erase voltage. The first bit count is above a first threshold and the second bit count is above a second threshold. The block is classified as the SLC erased block. The first bit count is above a first threshold and the second bit count is below a second threshold. The block is defined as a TLC program abort on the page0. The block is TLC erased. The block placed in a TLC non-pre erased heap.

In another embodiment, a data storage device includes memory means and a controller coupled to the memory means. The controller is configured to determine that a block is in an erased state, attempt to determine that the block is a SLC erased block or a TLC erased block, flash fill the block, and erase the block.

The flash filling occurs after the attempting to determine is inconclusive. The controller is further configured to place the block in either a SLC heap or a TLC heap.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
 a memory device; and
 a controller coupled to the memory device, the controller configured to:
  determine that a power loss event has occurred;
  determine that one or more blocks are in an erased state;
  examine a block of the one or more blocks to determine whether the block is a SLC erased block or a TLC erased block; and
  place the block in a SLC pre-erase heap if the block is the SLC erased block or in a TLC pre-erase heap if the block is the TLC erased block.

2. The data storage device of claim 1, wherein the block is a hybrid block, and wherein the hybrid block is configured to store either SLC data or TLC data.

3. The data storage device of claim 1, wherein the controller is further configured to check a first bit count at a first erase voltage threshold on page0 of the block.

4. The data storage device of claim 3, wherein, based upon the first erase voltage threshold, the controller is further configured to classify the block as the TLC erased block or the SLC erased block.

5. The data storage device of claim 4, wherein the controller is further configured to place the block in the TLC pre-erase heap upon classifying the block as the TLC erased block.

6. The data storage device of claim 3, wherein the controller is further configured to check a second bit count at a second erase voltage threshold on page1 of the block.

7. The data storage device of claim 6, wherein the checking occurs after determining that the first bit count is above a bit count threshold for the first erase voltage threshold.

8. The data storage device of claim 6, wherein, based upon the second erase voltage threshold, the controller is further configured to classify the block as the TLC erased block or the SLC erased block.

9. The data storage device of claim 1, wherein the controller is further configured to determine if erasing is needed upon the examining.

10. The data storage device of claim 9, wherein the controller is further configured to erase the block when the block cannot be determined as the SLC erased block or the TLC erased block.

11. The data storage device of claim 10, wherein the controller is further configured to flash fill the block prior to the erasing.

12. A data storage device, comprising:
 a memory device; and
 a controller coupled to the memory device, the controller configured to:
  determine that a block is an erased state;
  determine a first bit count of page0 for a SLC voltage for the block;
  determine a second bit count of page1 for a TLC voltage for the block; and
  classify the block as either a SLC erased block or a TLC erased block.

13. The data storage device of claim 12, wherein the SLC voltage is a SLC erase voltage.

14. The data storage device of claim 12, wherein the TLC voltage is a TLC erase voltage.

15. The data storage device of claim 12, wherein the first bit count is above a first threshold and the second bit count is above a second threshold, and wherein the block is classified as the SLC erased block.

16. The data storage device of claim 12, wherein the first bit count is above a first threshold and the second bit count is below a second threshold.

17. The data storage device of claim 16, wherein the block is defined as a TLC program abort on the page0, wherein the block is TLC erased, and wherein the block placed in a TLC non-pre erased heap.

18. A data storage device, comprising:
   memory means; and
   a controller coupled to the memory means, the controller configured to:
      determine that a block is in an erased state;
      attempt to determine that the block is a SLC erased block or a TLC erased block;
      flash fill the block; and
      erase the block.

19. The data storage device of claim 18, wherein the flash filling occurs after the attempting to determine is inconclusive.

20. The data storage device of claim 18, wherein the controller is further configured to place the block in either a SLC heap or a TLC heap.

* * * * *